United States Patent
Tanaka

(10) Patent No.: US 9,553,237 B2
(45) Date of Patent: Jan. 24, 2017

(54) LIGHT EMITTING ELEMENT

(71) Applicant: NICHIA CORPORATION, Anan-shi, Tokushima (JP)

(72) Inventor: Hidetoshi Tanaka, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/869,667

(22) Filed: Sep. 29, 2015

(65) Prior Publication Data

US 2016/0093774 A1    Mar. 31, 2016

(30) Foreign Application Priority Data

Sep. 30, 2014 (JP) ................. 2014-201511

(51) Int. Cl.
| | |
|---|---|
| H01L 27/15 | (2006.01) |
| H01L 29/267 | (2006.01) |
| H01L 31/12 | (2006.01) |
| H01L 33/00 | (2010.01) |
| H01L 33/38 | (2010.01) |
| H01L 33/20 | (2010.01) |
| H01L 33/26 | (2010.01) |

(52) U.S. Cl.
CPC .............. *H01L 33/38* (2013.01); *H01L 33/00* (2013.01); *H01L 33/20* (2013.01); *H01L 33/26* (2013.01)

(58) Field of Classification Search
CPC .......... H01L 33/20; H01L 33/36; H01L 33/38; H01L 33/00
USPC .................................................. 257/81, 99
See application file for complete search history.

(56) References Cited

U.S. PATENT DOCUMENTS

| | | | |
|---|---|---|---|
| 2003/0137031 A1* | 7/2003 | Young ................. | H01L 27/0203 257/627 |
| 2005/0127817 A1* | 6/2005 | Wu ........................ | H01L 33/38 313/500 |
| 2006/0113548 A1* | 6/2006 | Chen ...................... | H01L 33/08 257/79 |
| 2007/0085095 A1* | 4/2007 | Ko .......................... | H01L 33/38 257/94 |
| 2010/0117114 A1* | 5/2010 | Suzuki .................... | H01L 33/38 257/99 |
| 2011/0114966 A1 | 5/2011 | Liu et al. | |

(Continued)

FOREIGN PATENT DOCUMENTS

| | | |
|---|---|---|
| JP | 2011-114240 A | 6/2011 |
| JP | 2013-197197 A | 9/2013 |

*Primary Examiner* — Teresa M Arroyo
(74) *Attorney, Agent, or Firm* — Foley & Lardner LLP

(57) ABSTRACT

A light emitting element includes a semiconductor layer; an upper electrode disposed on an upper surface of the semiconductor layer; and a lower electrode disposed on a lower surface of the semiconductor later. In a plan view, the upper electrode includes a first extending portion extending in an approximately rectangular shape along an outer periphery of the semiconductor layer, a first pad portion connected to a first side among four sides of the first extending portion, a second pad portion connected to a second side that is opposite to the first side, among the four sides of the first extending portion, and a second extending portion and a third extending portion, each disposed in a region surrounded by the first extending portion, the second extending portion and the third extending portion each connecting the first pad portion and the second pad portion.

10 Claims, 8 Drawing Sheets

(56) References Cited

U.S. PATENT DOCUMENTS

| | | | |
|---|---|---|---|
| 2013/0032848 A1* | 2/2013 | Chen | H01L 33/38 257/99 |
| 2013/0146920 A1* | 6/2013 | Hong | H01L 33/36 257/98 |
| 2013/0248907 A1 | 9/2013 | Kato et al. | |
| 2014/0014895 A1 | 1/2014 | Tanaka | |
| 2014/0048840 A1* | 2/2014 | Kim | H01L 33/62 257/99 |
| 2014/0203451 A1* | 7/2014 | Kwon | H01L 23/481 257/774 |
| 2014/0264411 A1* | 9/2014 | Lin | H01L 33/38 257/98 |

* cited by examiner

LIGHT EMITTING ELEMENT

CROSS-REFERENCE TO RELATED APPLICATION

This application claims priority to Japanese Patent Application No. 2014-201511 filed on Sep. 30, 2014 . The entire disclosure of Japanese Patent Application No. 2014-201511 is hereby incorporated herein by reference.

BACKGROUND

1 . Technical Field

The present disclosure relates to a light emitting element that includes a semiconductor layer, an upper electrode disposed on an upper surface of the semiconductor layer, and a lower electrode disposed on a lower surface of the semiconductor layer.

2 . Background Art

There have been light emitting elements in which a "pad" is disposed on at each of two adjacent corners of an approximately rectangular upper surface of a semiconductor layer, and a "fine wire electrode" is disposed in a grid shape extending from the pad electrode, as described in JP2013-197197A.

However, with such a conventional structure, uneven emission tends to occur. Generally, a higher current density occurs in a region close to the pad to which the wire for supplying current from an external power source is connected, and even with a fine wire electrode, the current density decreases as the distance from the pad increases. As a result, stronger emission occurs near the pad, which tends to result in uneven brightness in the emission of the light emitting element as a whole.

Certain embodiments of the present invention have been devised in view of such circumstances, and an object thereof is to provide a light emitting element that can emit light more uniformly.

According to certain embodiments of the present invention, a light emitting element includes a semiconductor layer, an upper electrode disposed on an upper surface of the semiconductor layer, and a lower electrode disposed on a lower surface of the semiconductor layer. The light emitting element has an approximately rectangular shape in a plan view. In the plan view, the upper electrode includes a first extending portion extending in an approximately rectangular shape with four sides, along outer periphery of the semiconductor layer, a first pad portion connected to a first side among the four sides of the first extending portion, a second pad portion connected to a second side which is opposite to the first side, and a second extending portion and a third extending portion each disposed in a region surrounded by the first extending portion and respectively connecting the first pad portion and the second pad portion. With respect to a first straight line connecting the first pad portion and the second pad portion with a shortest distance, the second extending portion is disposed in a region closer to the third side of the four sides, and the third extending portion is disposed in a region closer to the forth side which is opposite to the third side. On a second straight line perpendicularly bisecting the first straight line, a distance between the second extending portion and the third extending portion is equal to or greater than a shortest distance between the first extending portion and the second extending portion, and equal to or greater than a shortest distance between the first extending portion and the third extending portion.

According to certain embodiments of the present invention, it is possible to obtain a light emitting element in which uneven current density on the upper surface of the semiconductor layer can be reduced, which allows for more uniform emission.

DETAILED DESCRIPTION

Figure 1:
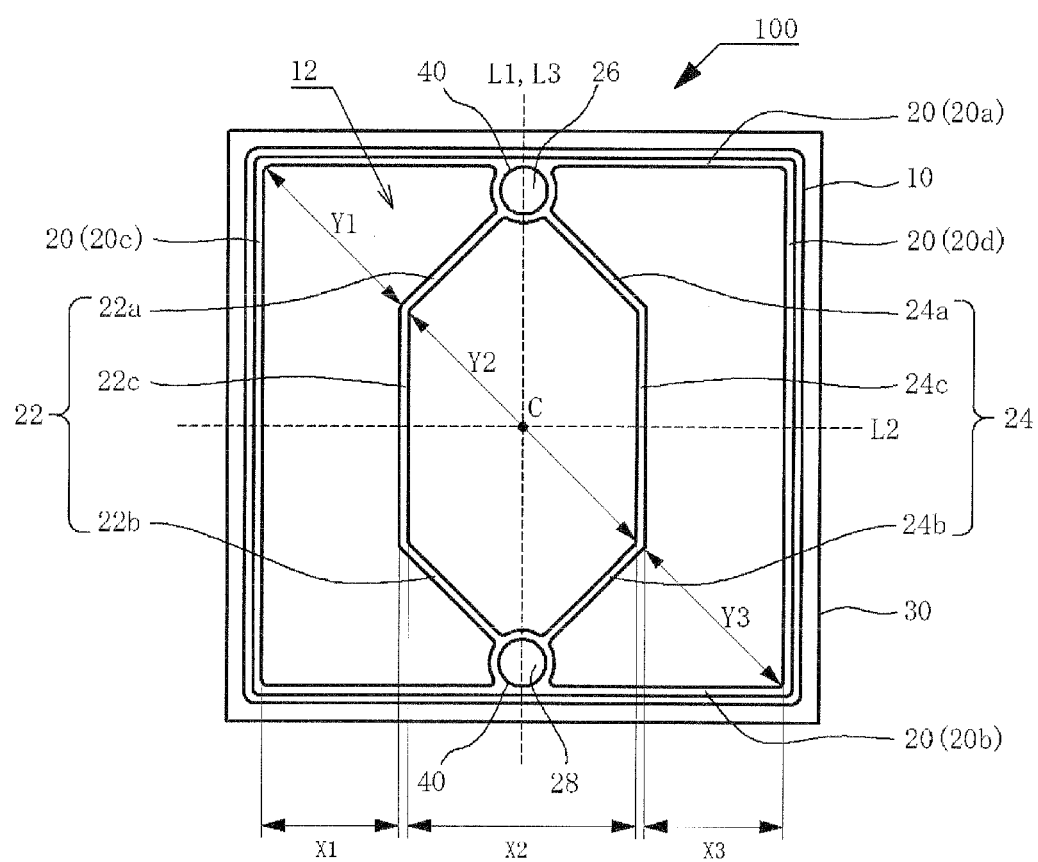
FIG. 1 is a schematic plan view, seen from an upper electrode side, of a light emitting element according to a first embodiment.

A light emitting element according to embodiments the present invention will be described below with reference to the accompanying drawings. The embodiments shown below are intended as illustrative to give concrete form to technical ideas of the present invention, and the scope of the invention is not limited to those described below. Further, in the description below, the same designations or the same reference numerals denote the same or like members and duplicative descriptions will be appropriately omitted.

First Embodiment

Figure 2:
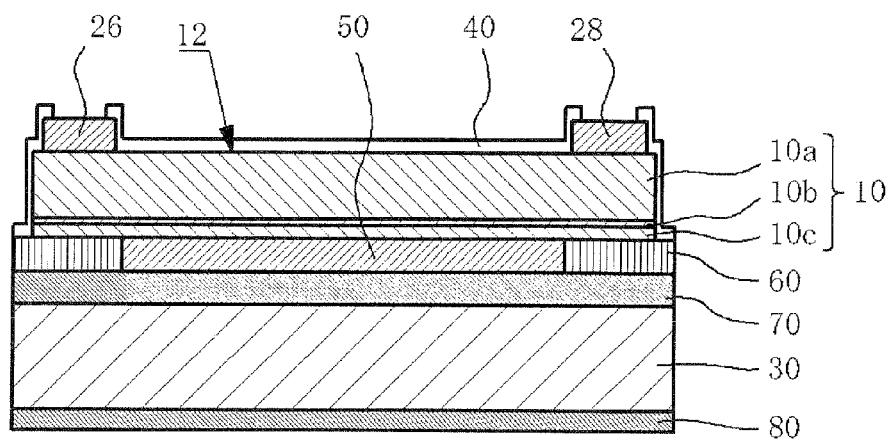
FIG. 2 is a schematic cross sectional view taken along line L1 of FIG. 1.
Figure 3:
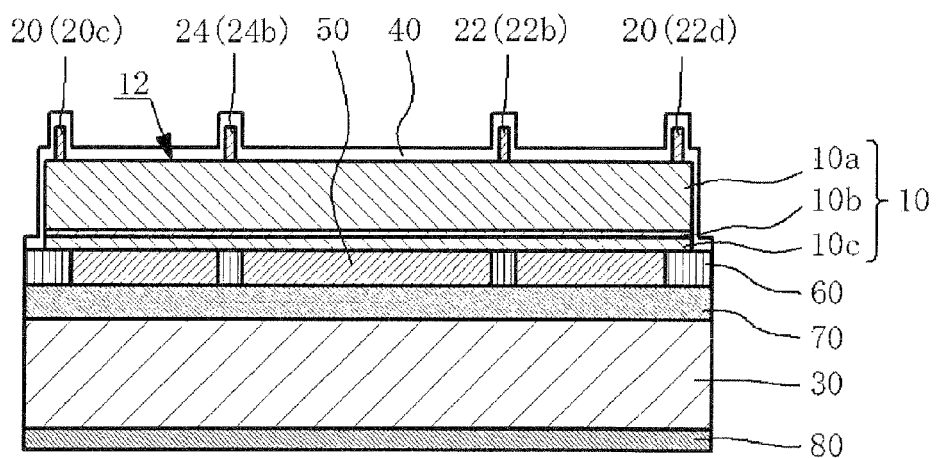
FIG. 3 is a schematic cross sectional view taken along line L2 of FIG. 1.
Figure 4:
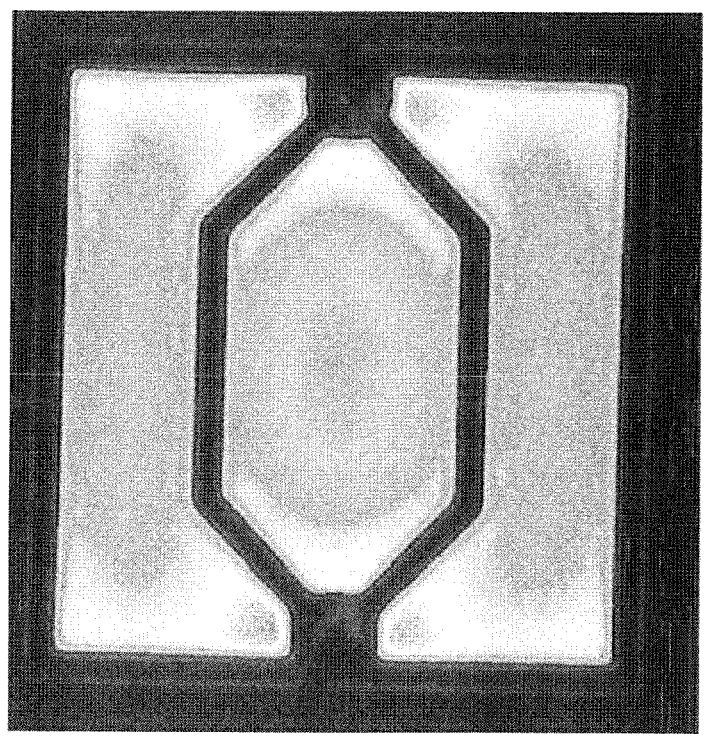
FIG. 4 is a diagram illustrating an emission intensity distribution of the light emitting element according to the first embodiment.

FIG. 1 is a schematic plan view, seen from an upper electrode side, of a light emitting element 100 according to a first embodiment. FIG. 2 is a schematic cross sectional view taken along line L1 of FIG. 1A, and FIG. 3 is a schematic cross sectional view taken along line L2 of FIG. 1. FIG. 4 is a diagram illustrating an emission intensity distribution of the light emitting element 100 according to the first embodiment, at an injection current of 500 mA.

As shown in FIGS. 1 to 4, the light emitting element 100 according to the first embodiment includes a semiconductor layer 10, an upper electrode disposed on an upper surface 12 of the semiconductor layer 10, and a lower electrode 50 disposed on a lower surface of the semiconductor layer 10, and has an approximately rectangular shape in a plan view. In a plan view, the upper electrode includes a first extending portion 20 extending in an approximately rectangular shape with four sides along an outer periphery of the semiconductor layer 10, a first pad portion 26 connected to a first side among the four sides of the first extending portion 20, a second pad portion 28 connected to a second side 20b which is opposite to the first side 20a, and a second extending portion 22 and a third extending portion 24, each disposed in a region surrounded by the first extending portion 20 and respectively connecting the first pad portion 26 and the second pad portion 28. With respect to a first straight line L1 connecting the first pad portion 26 and the second pad portion 28 with a shortest distance, the second extending portion 22 is disposed in a region closer to the third side 20c of the four sides, and the third extending portion 24 is disposed in a region closer to the forth side 20d opposite to the third side 20c. On a second straight line L2 perpendicularly bisecting the first straight line L1, a distance X2 between the second extending portion 22 and the third extending portion 24 is equal or greater than a shortest distance X1 between the first extending portion 20 and the second extending portion 22, and equal or greater than a shortest distance X3 between the first extending portion 20 and the third extending portion 24.

With this arrangement, uneven current density on the upper surface 12 of the semiconductor layer 10 can be reduced and more uniform emission can be obtained.

Generally, an electrically conductive member such as a wire is connected to the pad portion to inject current to the light emitting element. As a result, a higher current density occurs in a region close to the pad portion and the current density decreases as the distance from the pad portion increases. In order to compensate for uneven current density, an extending portion extending from the pad portion may be provided to diffuse the electric current in a wider region. However, even when such an extending portion is provided, the current density decreases as the distance from the pad portion increases. Thus, uniform emission of the light emitting element as a whole has been difficult to obtain.

Accordingly, in the light emitting element 100, among the four sides of the first extending portion 20 having an approximately rectangular shape, the first pad portion 26 is disposed connected to the first side 20a and the second pad portion 28 is disposed connected to the second side 20b opposite the first side 20a. Thus, excessive distribution of current density in a region closer to one of opposite sides of the first extending portion 20 can be reduced. Further, a second extending portion and a third extending portion are respectively disposed in a region surrounded by the first extending portion, so as to connect the first pad portion and the second pad portion respectively. This arrangement allows for an increase in the amount of electric current flows into the second extending portion 22 and the third extending portion 24 which are closer to each pad portion 26 and 28 than to the first extending portion 20. In addition, with respect to the first straight line L1 connecting the first pad portion 26 and the second pad portion in a shortest distance, the second extending portion 22 is arranged in a region closer to the third side 20c, and the third extending portion 24 is arranged in a region closer to the fourth side 20d which is opposite to the third side. According to this configuration, a center portion C which is spaced apart from the first pad portion 26 and the second pad portion 28 and has a low electric current density can be surrounded by the second extending portion 22 and the third extending portion 24, so that the electric current can be concentrated from the high current density portions around the pad electrodes 26 and 28. Further, on a second straight line L2 perpendicularly bisecting the first straight line L1, a distance X2 between the second extending portion 22 and the third extending portion 24 is equal to or greater than a shortest distance X1 between the first extending portion 20 and the second extending portion 22, and equal to or greater than a shortest distance X3 between the first extending portion 20 and the third extending portion 24. With this configuration, excessively high electrical density in a region surrounded by the second extending portion 22 and the third extending portion 24 can be prevented compared to a region between the third side 20c of the first extending portion 20 and the second extending portion 22 (22c), and the region between the fourth side 22d of the first extending portion 20 and the third extending portion 24 (24c). Accordingly, uneven distribution of current density in the upper surface 12 of the semiconductor layer 10 can be reduced and as shown in FIG. 4, more uniform light emission becomes possible to obtain. In the specification, the term "center portion C" refers to an intersection point of two straight lines which are crossing each other and equally or approximately equally dividing the upper surface 12 of the semiconductor layer 10 in four areas. For example, as shown in FIG. 1, in the case where the upper surface 12 of the semiconductor layer 10 has a square shape, the intersection point of two diagonal lines can serve as the "center portion C".

The main components of the light emitting element 100 will be described below.

Semiconductor Layer 10

The materials and/or the structure of the semiconductor layer 10 are not specifically limited and can be selected from various appropriate materials and structures. In the first embodiment, a structure in which an n-type semiconductor layer 10a, an active layer 10b, a p-type semiconductor layer 10c are stacked in this order is employed; nitride semiconductors such as $In_XAl_YGa_{1-X-Y}N$ ($0=<X<1$, $0=<Y<1$, $0=<X+Y<1$) are used as the material of each layer. The nitride semiconductors have higher internal resistance compared to that of other materials such as GaAs, so that efficient current spreading is difficult to obtain. Accordingly, an especially effective result can be expected in the case of forming the semiconductor layer with nitride semiconductors in the first embodiment.

In the first embodiment, the n-type semiconductor layer 10a is referred to as the upper surface 12 and the p-type semiconductor layer 10c is referred to as the lower surface. In the light emitting element 100, the upper surface 12 serves as the light extracting surface, and the lower surface is electrically connected to a support member 30 or the like, which will be described below. The upper surface 12 preferably has a rectangular shape. Generally, individual light emitting elements are singulated from a wafer, so that in view of manufacturing yield, the upper surface 12 preferably has a square shape or an approximately square shape.

In the first embodiment, the upper surface 12 has a square shape with a side of about 1.0 mm, but the size of the upper surface 12 can be appropriately selected. In the case of the upper surface 12 having a square shape (or an approximately square shape), a side may be 0.5 mm or greater, preferably 0.8 mm or greater. This is because with a small planar dimension of the upper surface 12, the electric current density between the first pad portion 26 and the second pad portion 28 will be excessively high, which may be undesirable. The upper limit for a side is not specifically limited, but in order not to have excessively low electric current density around the center portion C, a side may be 2.0 mm or less, preferably 1.5 mm or less.

Upper Electrode 20, 22, 24, 26, 28

The upper electrode is provided on the upper surface 12 of the semiconductor layer 10, and at least includes the first pad portion 26, the second pad portion 28, the first extending portion 20, the second extending portion, and the third extending portion 24. More specifically, in a plan view of the light emitting element 100 seen from an upper surface 12 side, of the four sides of the rectangular shape of the outer periphery of the semiconductor layer 10, the first pad portion 26 is disposed near one of the four sides and the second pad portion is disposed near the side which is opposite to the one of the four sides. The first pad portion 26 and the second pad portion 28 are the portions to which electric current is supplied from outside via conductive members such as wires.

The first pad portion 26 and the second pad portion 28 are connected to the first extending portion 20 which extends in an approximately rectangular shape along the outer periphery of the semiconductor layer 10. More specifically, in the region surrounded by the first extending portion 20, the first pad portion 26 is connected to the first side 20a among the four sides of the first extending portion 10, and the second pad portion 28 is connected to the second side 20b that is opposite to the first side 20a. As described above, the first pad portion 26 and the second pad portion 28 are connected in the regions surrounded by the first extending portion 20, that is, connected to inner sides than the first extending portion 20, so that the region surrounded by the first extending portion 20 can be increased. Thus, this configuration is preferable, allowing for a larger light emitting surface area of the light emitting element 100. The first pad portion 26 and the second pad portion 28 are respectively arranged on a third straight line L3 passing through the intersection point of the diagonal lines of the first extending portion 20. With this arrangement, the pad portions 26 and 28 are arranged substantially point symmetrical to the center portion C, so that uneven distribution of electric current density in the region surrounded by the first extending portion 20 can be reduced. Further, in this configuration, the first pad portion 26 and the second pad portion 28 are arranged such that the straight line L1 connecting the first pad portion 26 and the second pad portion 28 in a shortest distance is approximately in parallel to the third side 20c and the fourth side 20d, which are, among the four sides of the first extending portion 20, not provided with the pad portion 26 or 28. In other words, the first straight line L1 and the third straight line L3 are overlapped with each other. The first pad portion 26 and the second pad portion 28 have the same shortest distance from the third side 20c and the fourth side 20d, so that the electric current density can be prevented from being higher in a region closer to the third side 20c or the fourth side 20d.

The second extending portion 22 and the third extending portion 24 are disposed in a region surrounded by the first extending portion 20 so as to be spaced apart from each other and connected to both the first pad portion 26 and the second pad portion 28 at positions spaced apart from each other. With this configuration, the second extending portion 22 and the third extending portion 24 are spaced apart from each other and also connected to the first pad portion 26 and the second pad portion 28 respectively. Thus, a narrow region surrounded by the second extending portion and the third extending portion 24 at the connecting portions to the pad portions 26 and 28 (the corner portions formed by 22a and 24a, 22b and 24b) can be eliminated, which allows for suppressing the electric current density near the pad portions 26 and 28 from being excessively high. Particularly, it is preferable that the first extending portion 20 and the second extending portion 22 (22a, 22b) are connected to the first pad portion 26 and the second pad portion 28 respectively at equal intervals from adjacent extending portions, more specifically, at intervals of 60 degrees. With this configuration, uneven distribution of electric current density near the pad portions 26 and 28 can be further decreased.

The second extending portion 22 and the third extending portion 24 are disposed at opposite sides with respect to the first straight line L1 (a region closer to the third side 20c and a region closer to the fourth side 20d of the first extending portion 20), respectively, in approximately trapezoidal shapes at each side of the first straight line L1 in a plan view (i.e., with a base of the trapezoids being the first straight line L1, and the remaining sides of the trapezoids being the second extending portion 22 and the third extending portion 24, respectively). This allows for surrounding a wide area including the center portion C which is spaced apart from the pad portions 26 and 28 and the electric current density tends to decrease. More specifically, the second extending portion 22 is disposed closer to the third side 20c among the four sides of the first extending portion 20 with respect to the first straight line L1. That is, the second extending portion 22 has extending portions 22a, 22b extending from outer edges of the first pad portion 26 and the second pad portion 28, respectively, that are in the region closer to the third side 20c, in a straight line shape and at an angle so that the extending portions 22a and 22b are approaching each other and connected to respective ends of the extending portion 22c which is approximately parallel to the third side 20c. As described above, the second extending portion 22 includes a portion approximately in parallel to the third side 20c. More specifically, the approximately in parallel portion 22c of the second extending portion 22 with a length of a half or greater than the length of the third side 20c is preferable, in which case more uniform electric current density distribution can be obtained between the first extending portion 20 and the second extending portion 22. Meanwhile, the third extending portion 24 is disposed closer to the fourth side 20d which is closer to the third side 20c. More specifically, the third extending portion 24 has extending portions 24a, 24b extending from outer edges of the first pad portion 26 and the second pad portion 28, respectively, that are in the region closer to the fourth side 20d, in a straight line shape and at an angle so that the extending portions 24a and 24b are approaching each other and connected to respective ends of the extending portion 24c which is approximately in parallel to the fourth side 20d. As described above, the third extending portion 24 includes a portion approximately in parallel to the fourth side 20d. More specifically, the approximately in parallel portion 24c of the third extending portion 24 with a length of a half or greater than the length of the fourth side 20d is preferable, in which more uniform electric current density distribution can be obtained between the first extending portion 20 and the third extending portion 24.

In the first embodiment, on the second straight line L2 perpendicularly bisecting the first straight line L1, a distance X2 between the second extending portion 22 and the third extending portion 24 is equal to or greater than a shortest distance X1 between the first extending portion 20 and the second extending portion 22, and equal to or greater than a shortest distance X3 between the first extending portion 20 and the third extending portion 24. With this configuration, uneven distribution of electric current density in a region between the second extending portion 22 and the third extending portion 24 along the second straight line L2.

On the second straight line L2, the shortest distance X1 between the first extending portion 20 and the second extending portion 24 and the shortest distance X3 between the first extending portion 20 and the third extending portion 24 are preferably the same or the same. With this configuration, the electrical density in a region surrounded by the third side 20c of the first extending portion 20 and the second extending portion 22 (22c) and a region between the fourth side 20d of the first extending portion 20 and the third extending portion 24 (24c) can be made substantially uniform. Further, it is preferable that (i) the ratio of the shortest distance X1 between the first extending portion 20 and the second extending portion 22, the distance between the second extending portion 22 and the third extending portion 23, and the shortest distance between the first extending portion 20 and the third extending portion 24 on the straight line L2 and (ii) the ratio of the shortest distance Y1 between the first extending portion 20 and the second extending portion 22, the distance between the second extending portion 22 and the third extending portion 23, and the shortest distance between the first extending portion 20 and the third extending portion 24 on the diagonal line of the first extending portion 20, are the same. With this configuration, the state of spreading the electric current in the direction in the diagonal direction of the first extending portion 20 can be made similar to the state of spreading the electric current in the direction along the second straight line L2. Thus, concentration of the electric current in the direction along the second straight line L2 can be reduced and excessive reduction in the current electric current density in the vicinity of the corner portions of the first extending portion 20 can be reduced. The term "same" used in the specification is not limited to the case where the extending portions are arranged at precisely the same distance or at precisely the same rate. For example, a difference within ±10%, preferably within ±5%, more preferably within ±2%, may be regarded as arranged at a substantially the same distance or ratio and referred to as "the same".

The structure and the material of the upper electrode is not specifically limited and can be selected from various appropriate structures and the materials. In the first embodiment, the upper electrode has a stacked-layer structure of Ti/Pt/Au (Ti, Pt, Au are stacked in this order from the semiconductor layer side). The first pad electrode portion 26 and the second pad electrode portion 28 have an appropriate circular shape with a diameter of about 100 μm. The sizes of the pad portions 26, 28 can be determined according to the amount of the electric current supplied to the light emitting element 100 and the size of the upper surface 12 of the semiconductor layer 10. Also, the widths of the first extending portion 20, the second extending portion 22, and the third extending portion 24 are about 15 μm, which can be adjusted according to the amount of injecting current or the like. The thicknesses of the first extending portion 20, the second extending portion 22, and the third extending portion 24 are also not to be limited, but for example, in view of electrically conducting property, about 1 μm to about 5 μm is preferable and about 1 μm to about 3 μm is more preferable.

Lower Electrode 50

The lower electrode 50 is an electrode disposed on a lower surface of the semiconductor layer 10. The lower electrode 50 is preferably disposed at a position so as not to overlap the upper electrode when seen through the upper surface 12 side of the semiconductor layer 10. This is because as described above, shifting the positions of the upper electrode and the lower electrode 50 so as not to overlap each other allows for the electric current separately flowing in the semiconductor layer 10, which can further reduce the uneven distribution of electric current density. Accordingly, an insulating film 60 such as $SiO_2$ is preferably provided in a region on the lower surface of the semiconductor layer 10 where the lower electrode 50 is not provided. This is because the bonding layer 70 which will be described below can be prevented from being connected to the lower surface of the semiconductor layer 10 at The support member is not limited and a known support member can be used. For example, in the first embodiment, the lower electrode 50 has a stacked-layer structure of Ag/Ni/Ti/Pt, in this order from the semiconductor layer 10 side.

Supporting Member 30

The supporting member 30 is not an essential component, but the light emitting element 100 includes the supporting member 30 to support the semiconductor layer 10, and the supporting member 30 is electrically connected to the lower electrode 50 through the bonding layer 70 which will be described below. The materials and/or the structure of the supporting member 30 are not specifically limited and can be selected from various appropriate materials and structures. For example, in the first embodiment, Si is used as the material of the supporting member 30, and in view of bonding property at the time of mounting the light emitting element 100, a metal layer 80 which contains Au or the like is preferably provided on the entire lower surface of the supporting member 30.

Bonding Layer 70

The bonding layer 70 is an electrically conductive member for bonding the supporting member 30 to the lower electrode 50 and the insulating film 60. The materials and/or the structure of the bonding layer 70 are not specifically limited and can be selected from various appropriate materials and structures. For example, in the first embodiment, the bonding layer 70 has a stacked-layer structure of Ti/Pt/Au/Pt/Ti, in this order from the semiconductor layer 10 side.

Protective Film 40

The protective film 40 is a member for protecting the semiconductor layer 10 from physical damages caused by short circuit or by adhesion of dust or the like. The protective film 40 defines openings in conformity to the upper surfaces of the pad portions 26, 28 for providing regions for connecting wires or the like, and is disposed to cover the upper surface 12 and the side surfaces of the semiconductor layer 10. The materials and/or the structure of the protecting film 40 are not specifically limited and can be selected from various appropriate materials and structures, and for example, $SiO_2$ is used in the present embodiment.

Second Embodiment

Figure 5:
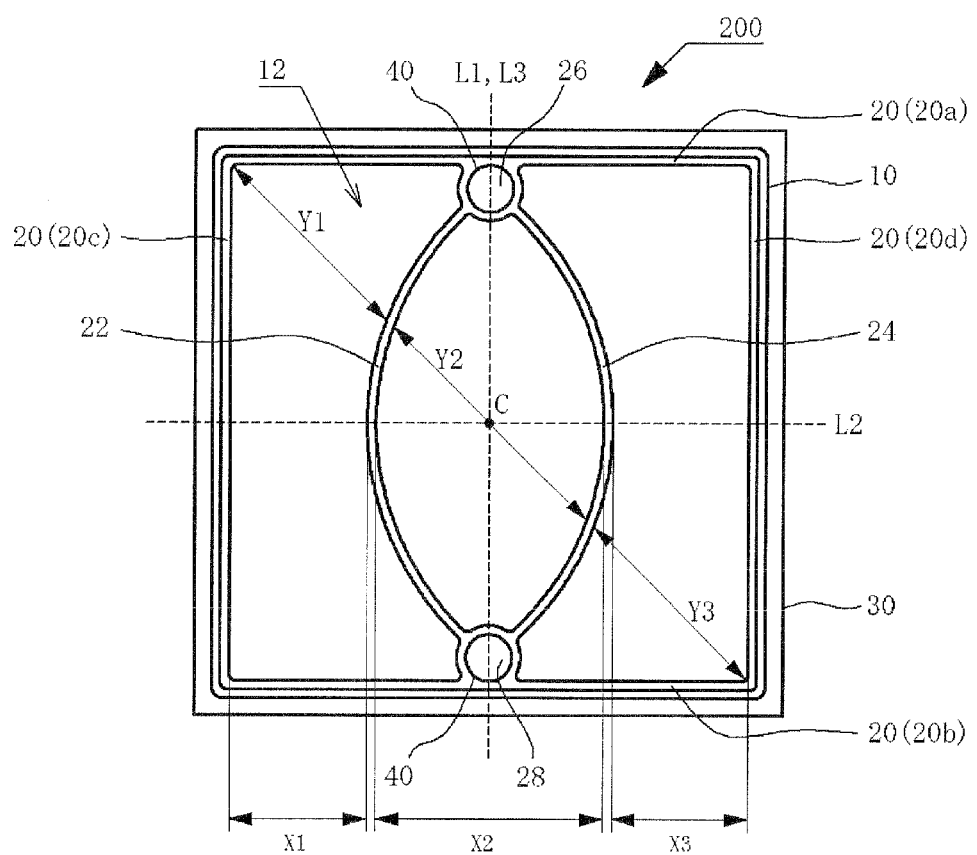
FIG. 5 is a schematic plan view, seen from an upper electrode side, of a light emitting element according to a second embodiment.

FIG. 5 is a schematic plan view, seen from an upper electrode side, of a light emitting element 200 according to a second embodiment. Next, the configurations different from those in the first embodiment will be described.

The light emitting element 200 according to the second embodiment differs from the light emitting element 100 in that the second extending portion 22 and the third extending portion 24 are arranged at opposite side of the first straight line L1 (in the region closer to the third side 20c and the region adjacent to the fourth side 20d of the first extending portion 20, respectively), each in a curved shape.

Accordingly, the area of the second extending portion 22 and the third extending portion 24 on the area of the upper surface 12 of the semiconductor layer 10 can be reduced and thus the light extraction efficiency can be enhanced. Further, bending portions can be eliminated from the second extending portion 22 and the third extending portion 24, so that the distribution of electric current density near the second extending portion 22 and the third extending portion 24 can be made more uniform.

Third Embodiment

Figure 6:
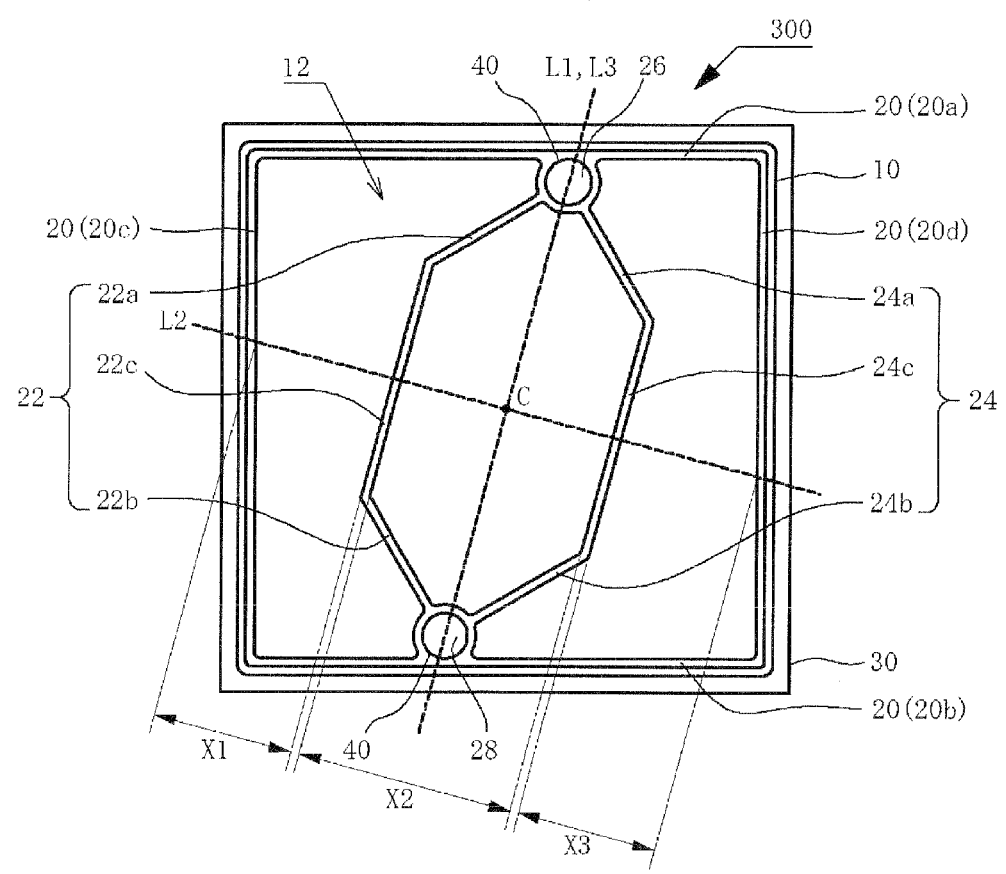
FIG. 6 is a schematic plan view, seen from an upper electrode side, of a light emitting element according to a third embodiment.

FIG. 6 is a schematic plan view, seen from an upper electrode side, of a light emitting element according to a third embodiment. Next, a light emitting device according to the second embodiment will be described.

The light emitting element 300 according to the third embodiment differs from the light emitting element 100 in that the first straight line L1 connecting the first pad portion 26 and the second pad portion 28 in a shortest distance is arranged passing through the intersection point of the diagonal lines of the first extending portion 20 and at an angle to the third side 20c and the fourth side 20d which are among the four sides of the first extending portion 20 and are not provided with the pad portion 26 or 28. The second extending portion 22 and the third extending portion 24 each connecting the pad portions 26 and 28 are arranged symmetrically with respect to the inclined first straight line L1.

This configuration allows for a longer distance between the pad portions 26 and 28, which can increase the region surrounded by the first extending portion 20, so that the region with a low electric current density can be reduced.

EXAMPLES

Figure 7:
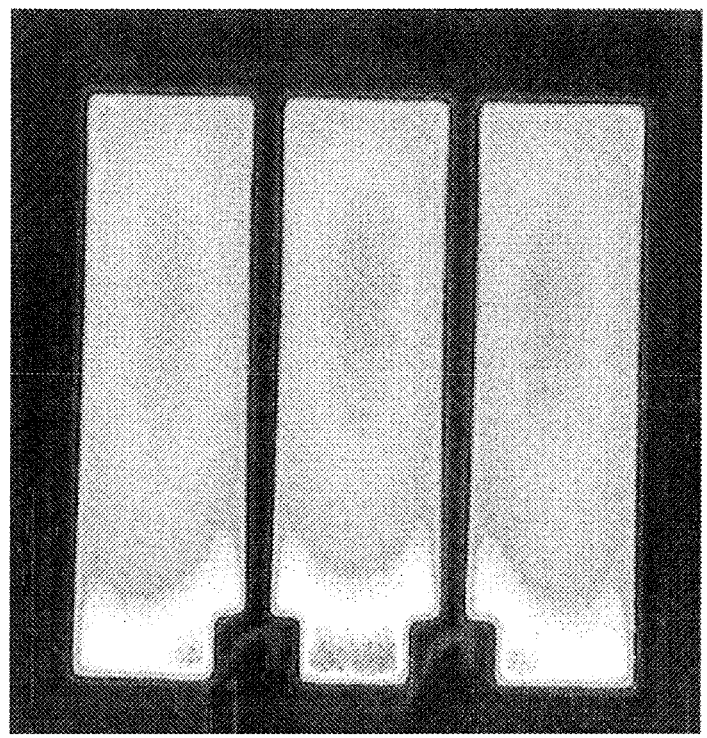
FIG. 7 is a diagram illustrating an emission intensity distribution of the light emitting element according to Comparative Example 1.
Figure 8:
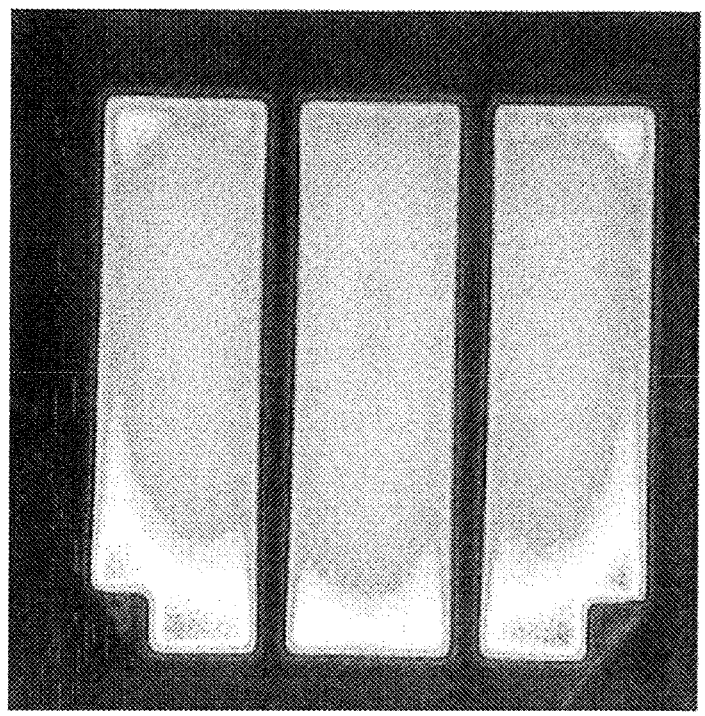
FIG. 8 is a diagram illustrating an emission intensity distribution of the light emitting element according to Comparative Example 2.

Effects of the light emitting element according to certain embodiments of the present invention will be described below with reference to FIG. 4 (Example 1), FIG. 7 (Comparative Example 1), and FIG. 8 (Comparative Example 2), which have different arrangements of the upper electrodes. FIG. 4, FIG. 7, and FIG. 8 show the light emission intensity measured from the upper surface (the light extracting surface) side of the semiconductor layer at an injection current of 500 mA.

Example 1

The light emitting element according to Example 1 has an electrode shape similar to that of the light emitting element 100 according to the first embodiment, and as shown in FIG. 4, the deviation in the distribution of the light emission intensity within the light extracting surface is improved compared to that in Comparative Example 1 (FIG. 7) and Comparative Example 2 (FIG. 8). In this case shown in FIG. 4, the forward voltage (Vf) is 3.70V, the optical output (Po) is 586 mW, and the luminous efficiency (WPE) is 31.7%.

Comparative Example 1

The light emitting element according to Comparative Example 1 includes the upper electrode having an extending portion with a rectangular ring shape extending in an approximately rectangular shape along the outer periphery of the semiconductor layer and two linear extending portions that divide the region surrounded by the rectangular ring shape in three equal parts. Further, two pad portions are respectively disposed at two intersections of one of four sides of the rectangular ring shape with the two linear extending portions.

As shown in FIG. 7, the light emission intensity is higher in the regions at the side where the pad portions are provided and lower in other regions, indicating occurrence of deviation in the distribution of the light emission intensity within the light extracting surface. In this case shown in FIG. 7, the forward voltage (Vf) is 3.74V, the optical output (Po) is 579 mW, and the luminous efficiency (WPE) is 31.0%.

Comparative Example 2

The light emitting element according to Comparative Example 2 differs from that of Comparative Example 1 in that the pad portions are arranged at two corners at the same side of the rectangular ring shape, which is an approximately the shape of the electrode of conventional light emitting elements (see JP 2013-197197 A).

As shown in FIG. 8, the light emission intensity is higher in the regions at the side where the pad portions are provided and lower in other regions, indicating occurrence of deviation in the distribution of the light emission intensity within the light extracting surface. In this case shown in FIG. 8, the forward voltage (Vf) is 3.74V, the optical output (Po) is 582 mW, and the luminous efficiency (WPE) is 31.1%.

The forward voltages (Vf), the optical outputs (Po), and the luminous efficiencies (WPE) of Example 1, Comparative Example 1, and Comparative Example 2 are shown in Table 1 for the ease of comparison.

TABLE 1

|  | Vf (V) | Po (mW) | WPE (%) |
| --- | --- | --- | --- |
| Example 1 | 3.70 | 586 | 31.7 |
| Comparative Example 1 | 3.74 | 579 | 31.0 |
| Comparative Example 2 | 3.74 | 582 | 31.1 |

As shown in Table 1, with respect to Comparative Example 1, Example 1 shows a 0.04 V lower Vf value, a 7 mW higher Po value, and a 0.7% higher WPE value. Further, with respect to Comparative Example 2, Example 1 shows a 0.4 V lower Vf value, a 4 mW higher Po value, and a 0.6% higher WPE value. Thus, any values obtained in Example 1 are higher than that of Comparative Example 1 and Comparative Example 2.

The light emitting elements according to embodiments of the present invention can be used, in addition to for general lighting, for various light sources for backlights of liquid crystals, headlights for vehicles, signals, large-scale displays, exposure devices, or the like. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting element comprising:
   a semiconductor layer;
   an upper electrode disposed on an upper surface of the semiconductor layer; and
   a lower electrode disposed on a lower surface of the semiconductor layer,
   wherein the upper surface has an approximately rectangular shape in a plan view,
   wherein, in the plan view, the upper electrode comprises:
      a first extending portion extending in an approximately rectangular shape along an outer periphery of the semiconductor layer,
      a first pad portion connected to a first side among four sides of the first extending portion,
      a second pad portion connected to a second side that is opposite to the first side, among the four sides of the first extending portion, and
      a second extending portion and a third extending portion, each disposed in a region surrounded by the first extending portion, the second extending portion and the third extending portion each connecting the first pad portion and the second pad portion, wherein, with respect to a first straight line connecting the first pad portion and the second pad portion by a shortest distance, the second extending portion is arranged in a region closer to the third side among the four sides and the third extending portion is arranged in a region closer to the fourth side which is opposite to the third side, and wherein, on a second straight line perpendicularly bisecting the first straight line, a distance between the second extending portion and the third extending portion is equal to or greater than a shortest distance between the first extending portion and the second extending portion, and equal to or greater than a shortest distance between the first extending portion and the third extending portion.

2. The light emitting element according to claim 1, wherein on the second straight line, the shortest distance between the first extending portion and the second extending portion is the same as the shortest distance between the first extending portion and the third extending portion.

3. The light emitting element according to claim 1, wherein (i) a ratio of the shortest distance between the first extending portion and the second extending portion, a distance between the second extending portion and the third extending portion, and the shortest distance between the first extending portion and the third extending portion on the second straight line, and (ii) a ratio of the shortest distance between the first extending portion and the second extending portion, a distance between the second extending portion and the third extending portion, and the shortest distance between the first extending portion and the third extending portion on a diagonal line of the first extending portion, are substantially the same.

4. The light emitting element according to claim 1, wherein the first pad portion and the second pad portion are arranged on a third straight line passing through an intersection point of lines extending diagonally across the first extending portion.

5. The light emitting element according to claim 4, wherein the first straight line is approximately parallel to the third side and the fourth side.

6. The light emitting element according to claim 5,
wherein the second extending portion includes a portion approximately parallel to the third side, and a flat portion of the second extending portion has a length of at least a half of a length of the third side, and wherein the third extending portion includes a portion approximately parallel to the fourth side, and a flat portion of the third extending portion has a length of at least a half of a length of the fourth side.

7. The light emitting element according to claim 1, wherein the second extending portion and the third extending portion are spaced apart from each other and are each connected to the first pad portion and the second pad portion.

8. The light emitting element according to one of claim 7, wherein the first extending portion, the second extending portion, and the third extending portion are connected to the first pad portion and the second pad portions at equal intervals from adjacent extending portions at intervals of 60 degrees.

9. The light emitting element according to one of claim 1, wherein, on the second straight line, the distance between the second extending portion and the third extending portion is greater than the shortest distance between the first extending portion and the second extending portion, and greater than the shortest distance between the first extending portion and the third extending portion.

10. The light emitting element according to claim 2, wherein (i) a ratio of the shortest distance between the first extending portion and the second extending portion, a distance between the second extending portion and the third extending portion, and the shortest distance between the first extending portion and the third extending portion on the second straight line, and (ii) a ratio of the shortest distance between the first extending portion and the second extending portion, a distance between the second extending portion and the third extending portion, and the shortest distance between the first extending portion and the third extending portion on a diagonal line of the first extending portion, are substantially the same.

* * * * *